US012586614B2

(12) United States Patent　　(10) Patent No.: US 12,586,614 B2
Kang　　(45) Date of Patent: Mar. 24, 2026

(54) DATA TRANSMISSION/RECEIVING CIRCUIT, DATA TRAINING CIRCUIT AND SEMICONDUCTOR APPARATUS INCLUDING THE SAME

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 174 days.

(21) Appl. No.: 18/545,860

(22) Filed: Dec. 19, 2023

(65) Prior Publication Data

US 2025/0095700 A1　　Mar. 20, 2025

(30) Foreign Application Priority Data

Sep. 18, 2023　(KR) ........................ 10-2023-0123868

(51) Int. Cl.
G11C 7/10　　(2006.01)

(52) U.S. Cl.
CPC ........ G11C 7/1048 (2013.01); G11C 2207/12 (2013.01)

(58) Field of Classification Search
CPC . G11C 7/1048; G11C 2207/12; G11C 7/1084; G11C 7/1078; G11C 7/1051; G06F 13/385; G06F 13/4072; G06F 2213/0002; G06F 2213/0004; G06F 2213/3852; H04L 25/0292; H03M 9/00
USPC ........................................ 365/189.18, 189.05
See application file for complete search history.

(56) References Cited

U.S. PATENT DOCUMENTS

| | | | |
|---|---|---|---|
| 7,246,018 B1 * | 7/2007 | Lo ................... | G01R 31/318552 |
| | | | 702/69 |
| 7,830,211 B2 * | 11/2010 | Cao ......................... | H03F 1/565 |
| | | | 330/307 |
| 7,888,966 B1 * | 2/2011 | Davidson ............. | G11C 7/1066 |
| | | | 326/62 |
| 8,037,377 B1 * | 10/2011 | Chia ................ | G01R 31/31716 |
| | | | 714/734 |
| 8,687,442 B1 * | 4/2014 | Thakore .............. | G06F 13/1689 |
| | | | 365/194 |
| 8,887,016 B1 * | 11/2014 | Lai ................. | G01R 31/318572 |
| | | | 714/763 |
| 8,896,352 B2 * | 11/2014 | Huang ................... | H03H 11/44 |
| | | | 327/108 |
| 9,413,565 B1 | 8/2016 | Jung | |
| 9,621,136 B1 * | 4/2017 | Chang ..................... | H03L 7/091 |
| 10,727,895 B1 * | 7/2020 | Nguyen ................... | H04B 1/44 |
| 2003/0039168 A1 * | 2/2003 | Chan .................... | G11C 7/1006 |
| | | | 365/49.17 |
| 2006/0151851 A1 * | 7/2006 | Pillai ................... | H10D 89/611 |
| | | | 257/536 |

(Continued)

*Primary Examiner* — Michael T Tran

(74) *Attorney, Agent, or Firm* — WILLIAM PARK AND ASSOCIATES LTD.

(57) ABSTRACT

A data receiving circuit includes a first inductor, a second inductor, and a T-coil equalization circuit. The first inductor is coupled between a first node coupled with a data input/ output pad and a second node. The second inductor is coupled between the second node and an internal circuit. The T-coil equalization circuit includes a T-coil with at least one capacitor coupled with the second node. The T-coil equalization circuit is configured to adjust inductive peaking of the T-coil in response to a control signal.

20 Claims, 7 Drawing Sheets

(56) References Cited

U.S. PATENT DOCUMENTS

| | | | |
|---|---|---|---|
| 2014/0185389 A1* | 7/2014 | Jeon ..................... | G11C 7/1093 |
| | | | 365/189.05 |
| 2019/0123551 A1* | 4/2019 | Yuan ........................ | H04B 1/16 |
| 2019/0253284 A1* | 8/2019 | Jalali Far .......... | H04L 25/03146 |
| 2021/0223659 A1* | 7/2021 | Appel ..................... | G02F 1/225 |

\* cited by examiner

SEMICONDUCTOR APPARATUS

DATA TRANSMISSION/RECEIVING CIRCUIT, DATA TRAINING CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2023-0123868 filed on Sep. 18, 2023, in the Korean Intellectual Property Office, which is incorporated herein by reference in its entirety.

BACKGROUND

1. Technical Field

Various embodiments generally relate to a semiconductor circuit, and, more particularly, to a data transmission/receiving circuit, a data training circuit, and a semiconductor apparatus including the same.

2. Related Art

FIG. 1 is a diagram illustrating a configuration of a data receiving circuit according to prior art. Referring to FIG. 1, a semiconductor apparatus according to the prior art receives data DIN transmitted by a host through a channel via a data input/output pad 11 and delivers it to a deserializer (DESER) 13.

Because the channel reduces the quality of the transmitted signal due to inter-symbol interference (ISI), the data is received through a continuous time linear equalizer (CTLE) 12 to compensate for this.

However, there is a problem of increasing the circuit area and current consumption of the data receiving circuit by using the continuous time linear equalizer 12, and there is a problem of decreasing the DC gain according to the operation of the time linear equalizer 12.

SUMMARY

In an embodiment, a data receiving circuit may include a first inductor, a second inductor, and a T-coil equalization circuit. The first inductor may be coupled between a first node coupled with a data input/output pad and a second node. The second inductor may be coupled between the second node and an internal circuit. The T-coil equalization circuit may include a T-coil with at least one capacitor coupled with the second node and may be configured to adjust inductive peaking of the T-coil in response to a control signal.

In an embodiment, a data training circuit may include a data receiving circuit, a deserializer, a data verification circuit, and a control circuit. The data receiving circuit may be coupled with a data input/output pad. The data receiving circuit may be configured to control inductive peaking according to a control signal and configured to receive data transmitted via the data input/output pad. The deserializer may be configured to deserialize data output from the data receiving circuit to generate parallel data. The data verification circuit may be configured to verify the parallel data to generate a data verification signal. The control circuit may be configured to vary a value of the control signal until the data verification signal has a value indicating that the parallel data has been transmitted normally.

In an embodiment, a data transmission/receiving circuit may include a data receiving circuit and a data transmission circuit. The data receiving circuit may include a first inductor coupled between a first node coupled with a data input/output pad and a second node, a second inductor coupled between the second node and a third node, and a T-coil equalization circuit including a T-coil including at least one capacitor coupled between the second node and a ground terminal. The T-coil equalization circuit may be configured to adjust inductive peaking of the T-coil in response to a control signal. The data transmission circuit may be coupled to the second node and configured to perform a driving operation and equalization operation on internally generated data.

In an embodiment, a data receiving circuit includes a T-coil including a first inductor, a second inductor, and a capacitor, wherein the first and second inductors are connected in series so that a second end of the first inductor is connected to a first end of the second inductor, and wherein a first end of the capacitor is connected to both the second end of the first inductor and the first end of the second inductor. The data receiving circuit also includes a plurality of switches, wherein a first end of each switch in the plurality of switches is connected to a second end of the capacitor. The data receiving circuit further includes a plurality of resistors wherein a first end of each resistor in the plurality of resistors is respectively connected to a second end of an associated switch in the plurality of switches, and wherein a second end of each resistor in the plurality of resistors is coupled to a ground terminal. The data receiving circuit additionally includes a termination resistor, wherein a first end of the termination resistor is coupled to a power supply, and wherein a second end of the termination resistor is coupled to a first end of the first inductor, between the second end of the first inductor and the first end of the second inductor, or to a second end of the second inductor. The first end of the first inductor is coupled to a data input/output pad. The second end of the second inductor is coupled to an internal circuit.

BRIEF DESCRIPTION OF THE DRAWINGS

FIG. 2 is a diagram illustrating a configuration of a data receiving circuit according to an embodiment of the present disclosure.

FIG. 3 is a diagram illustrating a configuration of a data receiving circuit according to an embodiment of the present disclosure.

DETAILED DESCRIPTION

Figure 1:
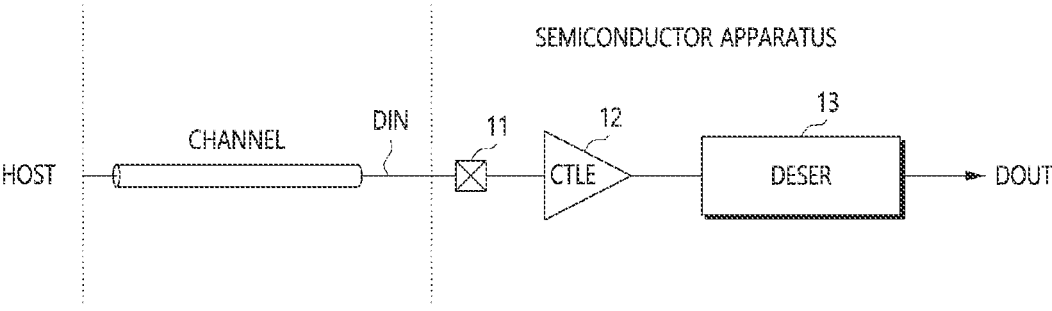
FIG. 1 is a diagram illustrating a configuration of a data receiving circuit according to prior art.

Various embodiments can improve signal quality without reducing DC gain and can increase layout margin and reduce current consumption.

Hereinafter, various embodiments will be described in more detail with reference to the accompanying drawings.

Figure 2:
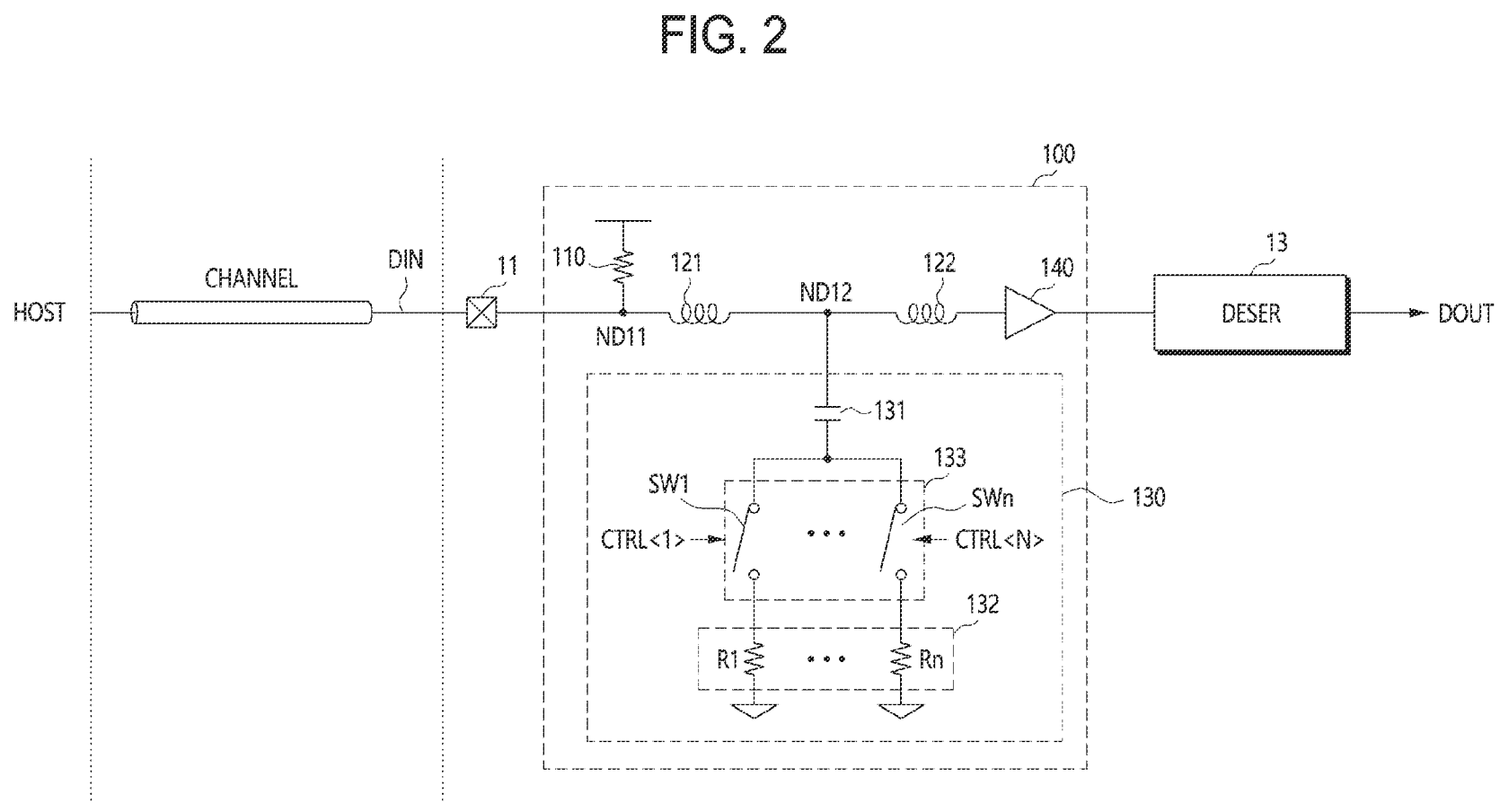

FIG. 2 is a drawing illustrating a configuration of a data receiving circuit 100 according to an embodiment.

Referring to FIG. 2, the data receiving circuit 100 may be coupled between a data input/output pad 11 and an internal circuit, for example, a deserializer (DESER) 13.

The example of the deserializer 13 as an internal circuit is given here because when the data transmitted via the data input/output pad 11 is input in serial form, it is necessary to deserialize the data received by the data receiving circuit 100. Therefore, the example of the deserializer 13 as an internal circuit is only an example, and the internal circuit may be changed depending on a data transmission method.

The data receiving circuit 100 may be coupled to a host via the data input/output pad 11 and a data transmission channel (hereinafter, the channel). The data receiving circuit 100 may output data DIN received via the data input/output pad 11 to a deserializer 13. The deserializer 13 may deserialize the data received from the data receiving circuit 100 to generate an output data DOUT.

The data receiving circuit 100 may include a termination resistor 110, a first inductor 121, a second inductor 122, and a T-coil equalization circuit 130. The data receiving circuit 100 may further include a buffer 140 coupled between the second inductor 122 and the deserializer 13, for buffering the data DIN after it passes through the second inductor 122.

A termination resistor 110 may be coupled between a power supply and a first node ND11. The first node ND11 may be associated with the data input/output pad 11. A first inductor 121 may be coupled between the first node ND11 and a second node ND12. The second inductor 122 may be coupled between the second node ND12 and the deserializer 13.

A T-coil equalization circuit 130 may be coupled with the second node ND12. The T-coil equalization circuit 130 may include a T-coil with at least one capacitor coupled to the second node ND12 that is coupled to the first inductor 121 and the second inductor 122, and may be configured to adjust inductive peaking of the T-coil in response to a control signal CTRL<1:N>.

T-coil equalization circuit 130 may include a capacitor 131, a resistor array 132, and a switching circuit 133.

The capacitor 131 may be associated with the second node ND12. The capacitor 131 may be coupled with the first inductor 121 and the second inductor 122 via the second node ND12 to form the T-coil.

The resistor array 132 may include a plurality of resistors R1-Rn. The plurality of resistors R1-Rn may be designed to have substantially same resistance value as each other. The plurality of resistors R1-Rn may also be designed to have different resistance values.

The switching circuit 133 may be coupled between the capacitor 131 and the plurality of resistors R1-Rn, and may be operated in response to the control signal CTRL<1:N>. The switching circuit 133 may control the inductive peaking of the T-coil by adjusting the impedance by selectively connecting the plurality of resistors R1-Rn with the capacitor 131 according to each signal bit of the control signal CTRL<1:N>. The switching circuit 133 may include a plurality of switches SW1-SWn. Each of the plurality of switches SW1-SWn may have one end commonly coupled to the capacitor 131 and the other end may be coupled to a resister of the plurality of resistors R1-Rn.

If the plurality of resistors R1-Rn are designed to have substantially same resistance value as each other, the impedance can be adjusted by varying the number of resistors selected among the plurality of resistors R1-Rn according to the control signal CTRL<1:N>. On the other hand, when the plurality of resistors R1-Rn are designed to have different resistance values, the impedance may be adjusted by selecting different resistors among the plurality of resistors R1-Rn according to the control signal CTRL<1:N>, and in addition to the above, the impedance may be adjusted by selecting the plurality of resistors R1-Rn in various ways according to the control signal CTRL<1:N>.

The data receiving circuit 100 according to an embodiment can compensate for signal quality degradation due to inter-symbol interference in the channel by varying the AC (alternating current) resistance of the T-coil equalization circuit 130 by adjusting the value of the control signal CTRL<1:N> while a DC (direct current) resistance by the termination resistor 110 is constant. By using the T-coil equalization circuit 130, there is no reduction in DC gain and the current consumption can be reduced compared to using a continuous time linear equalizer in the prior art.

Figure 3:
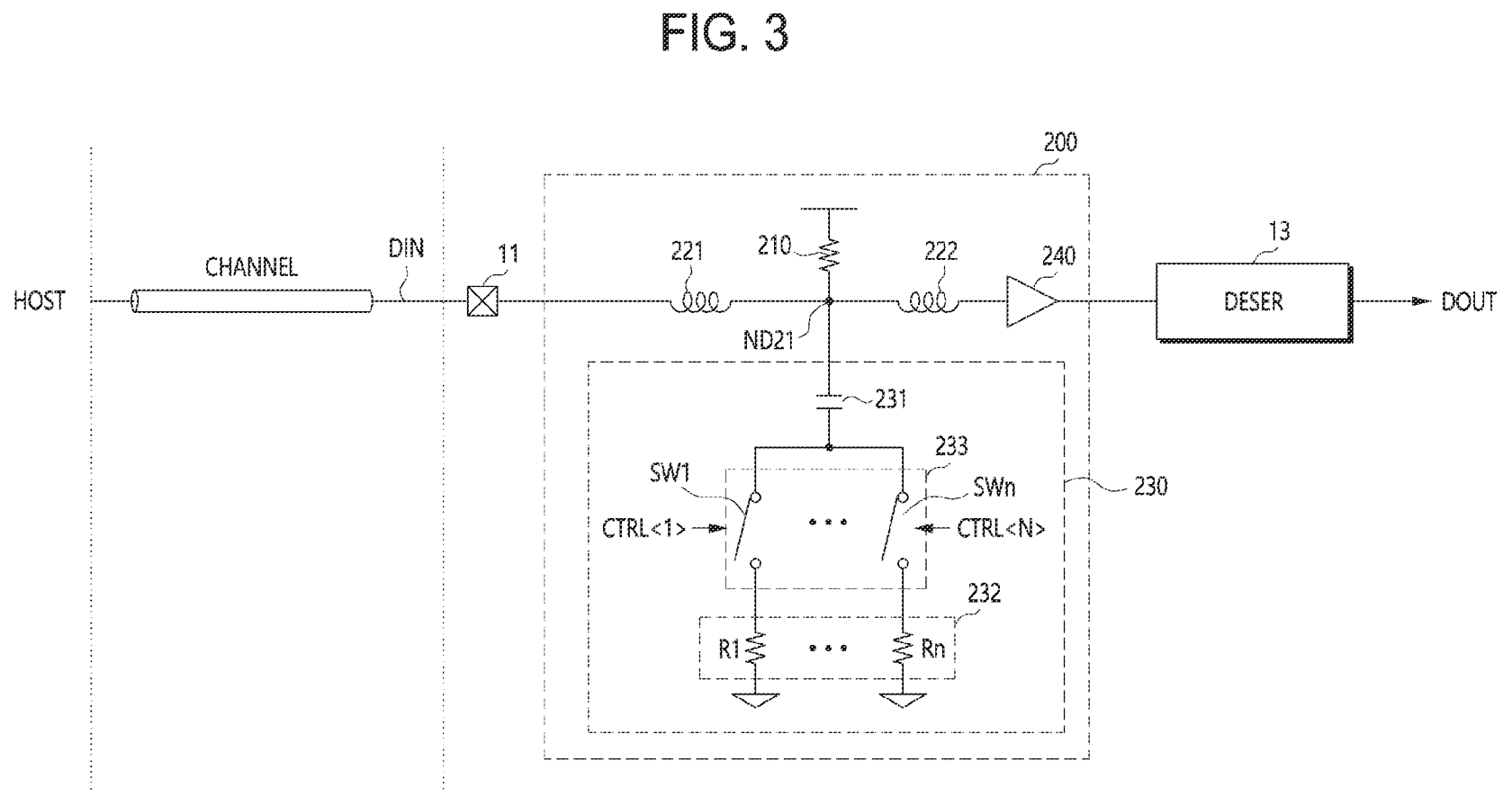

FIG. 3 is a diagram illustrating a configuration of a data receiving circuit 200 according to an embodiment.

Referring to FIG. 3, the data receiving circuit 200 may be coupled between a data input/output pad 11 and the deserializer (DESER) 13.

The data receiving circuit 200 may be coupled to the data input/output pad 11 and a host via a channel. The data receiving circuit 200 may output data DIN received via the data input/output pad 11 to the deserializer 13. The deserializer 13 may deserialize the data received from the data receiving circuit 200 to generate output data DOUT.

The data receiving circuit 200 may include a termination resistor 210, a first inductor 221, a second inductor 222, and a T-coil equalization circuit 230. The data receiving circuit 200 may further include a buffer 240 coupled between the second inductor 222 and the deserializer 13, for buffering the data DIN after it passes through the second inductor 222.

The first inductor 221 may be coupled between the data input/output pad 11 and a first node ND21. A second inductor 222 may be coupled between the first node ND21 and the deserializer 13. The termination resistor 210 may be coupled between the power supply and the first node ND21.

The T-coil equalization circuit 230 may be coupled with the first node ND21. The T-coil equalization circuit 230 may include a T-coil with at least one capacitor coupled to the first node ND21 that is coupled to the first inductor 221 and the second inductor 222, and may be configured to adjust inductive peaking of the T-coil in response to a control signal CTRL<1:N>.

The T-coil equalization circuit 230 may correspond to the T-coil equalization circuit 130 shown in FIG. 2. The T-coil equalization circuit 230 may include a capacitor 231, a resistor array 232 including a plurality of resistors R1-Rn, and a switching circuit 233 including a plurality of switches SW1-SWn.

The capacitor 231 may be associated with the first node ND21. The capacitor 231 may be coupled with the first inductor 221 and the second inductor 222 via the first node ND21 to form the T-coil.

The switching circuit 233 is coupled between the capacitor 231 and a plurality of resistors R1-Rn, and may be operated in response to the control signal CTRL<1:N>. The switching circuit 233 may control the inductive peaking of the T-coil by adjusting the impedance by selectively connecting the plurality of resistors R1-Rn with the capacitor 231 according to each signal bit of the control signal CTRL<1:N>. In different embodiments, one of more of the plurality of resistors R1-Rn can be selectively connected with the capacitor 231 in different combinations depending on the control signal CTRL<1:N>.

The data receiving circuit 200 according to an embodiment may compensate for signal degradation due to inter-symbol interference in the channel by varying the AC resistance of the T-coil equalization circuit 230 by adjusting the value of the control signal CTRL<1:N> while the DC resistance by the termination resistor 210 is constant. By using the T-coil equalization circuit 230, there is no reduction in DC gain, and the current consumption can be reduced compared to using a time-linear equalizer in the prior art.

Figure 4:
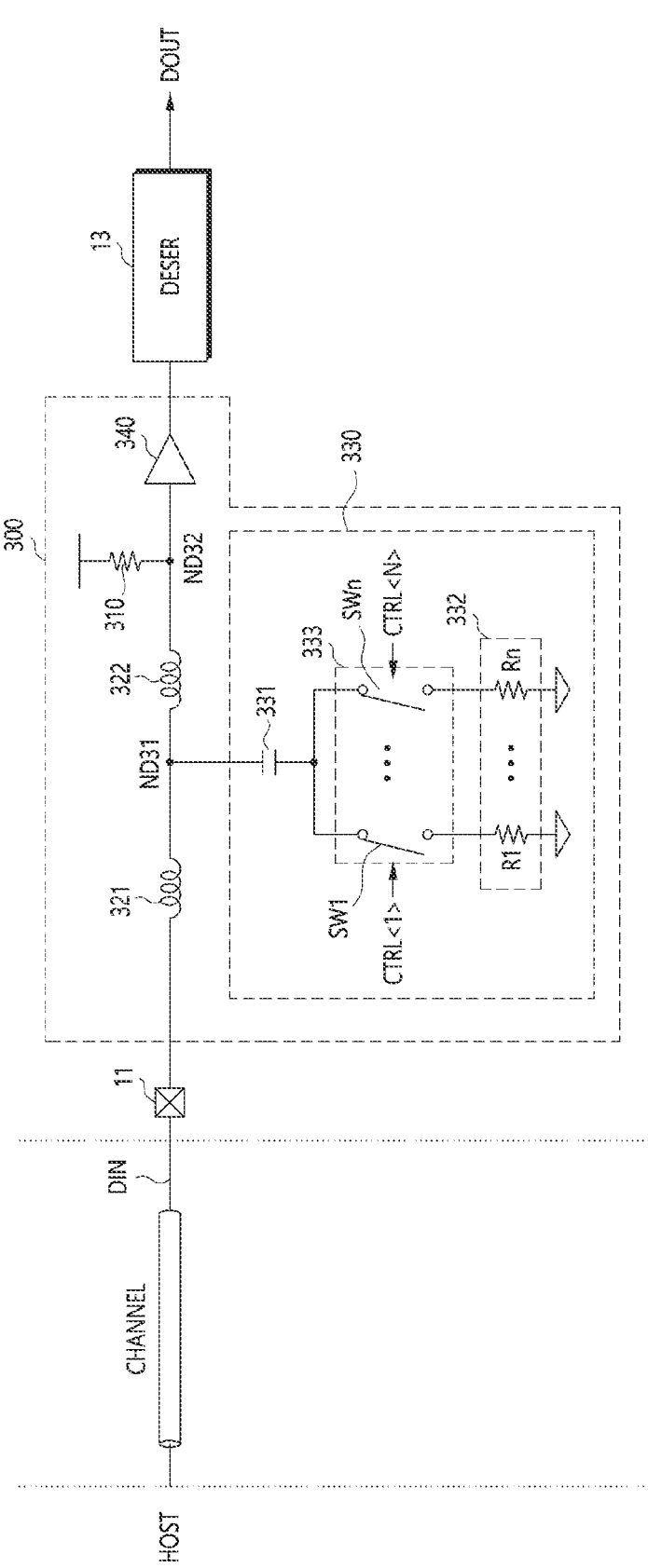
FIG. 4 is a diagram illustrating a configuration of a data receiving circuit according to an embodiment of the present disclosure.

FIG. 4 is a diagram illustrating a configuration of a data receiving circuit 300 according to an embodiment.

Referring to FIG. 4, the data receiving circuit 300 may be coupled between a data input/output pad 11 and a deserializer (DESER) 13.

The data receiving circuit 300 may be coupled to the data input/output pad 11 and a host via a channel. The data receiving circuit 300 may output data DIN received via the data input/output pad 11 to the deserializer 13. The deserializer 13 can deserialize the data received from the data receiving circuit 300 to generate output data DOUT.

The data receiving circuit 300 may include a termination resistor 310, a first inductor 321, a second inductor 322, and a T-coil equalization circuit 330. The data receiving circuit 300 may further include a buffer 340 coupled between the second inductor 322 and the deserializer 13, for buffering the data DIN after it passes through the second inductor 322.

The first inductor 321 may be coupled between the data input/output pad 11 and a first node ND31. The second inductor 322 may be coupled between the first node ND31 and a second node ND32. A termination resistor 310 may be coupled between the power supply and the second node ND32.

The T-coil equalization circuit 330 may be coupled with the first node ND31. The T-coil equalization circuit 330 may include a T-coil with at least one capacitor coupled to the first node ND31 that is coupled to the first inductor 321 and the second inductor 322, and may be configured to adjust inductive peaking of the T-coil in response to a control signal CTRL<1:N>.

The T-coil equalization circuit 330 may correspond to the T-coil equalization circuit 130 shown in FIG. 2. T-coil equalization circuit 330 may include a capacitor 331, a resistor array 332 including a plurality of resistors R1-Rn, and a switching circuit 333 including a plurality of switches SW1-SWn.

The capacitor 331 may be associated with the first node ND31. The capacitor 331 may be coupled with the first inductor 321 and the second inductor 322 via the first node ND31 to form the T-coil.

The switching circuit 333 is coupled between the capacitor 331 and the plurality of resistors R1-Rn, and may be operated in response to the control signal CTRL<1:N>. The switching circuit 333 can control the inductive peaking of the T-coil by adjusting the impedance by selectively connecting the plurality of resistors R1-Rn with the capacitor 331 according to each signal bit of the control signal CTRL<1:N>. In different embodiments, one of more of the plurality of resistors R1-Rn can be selectively connected with the capacitor 331 in different combinations depending on the control signal CTRL<1:N>.

The data receiving circuit 300 according to an embodiment may compensate for signal degradation due to inter-symbol interference in the channel by varying the AC resistance of the T-coil equalization circuit 330 by adjusting the value of the control signal CTRL<1:N> while the DC resistance by the termination resistor 310 is constant. By using the T-coil equalization circuit 330, there is no reduction in DC gain, and the current consumption can be reduced compared to using a time-linear equalizer in the prior art.

Figure 5:
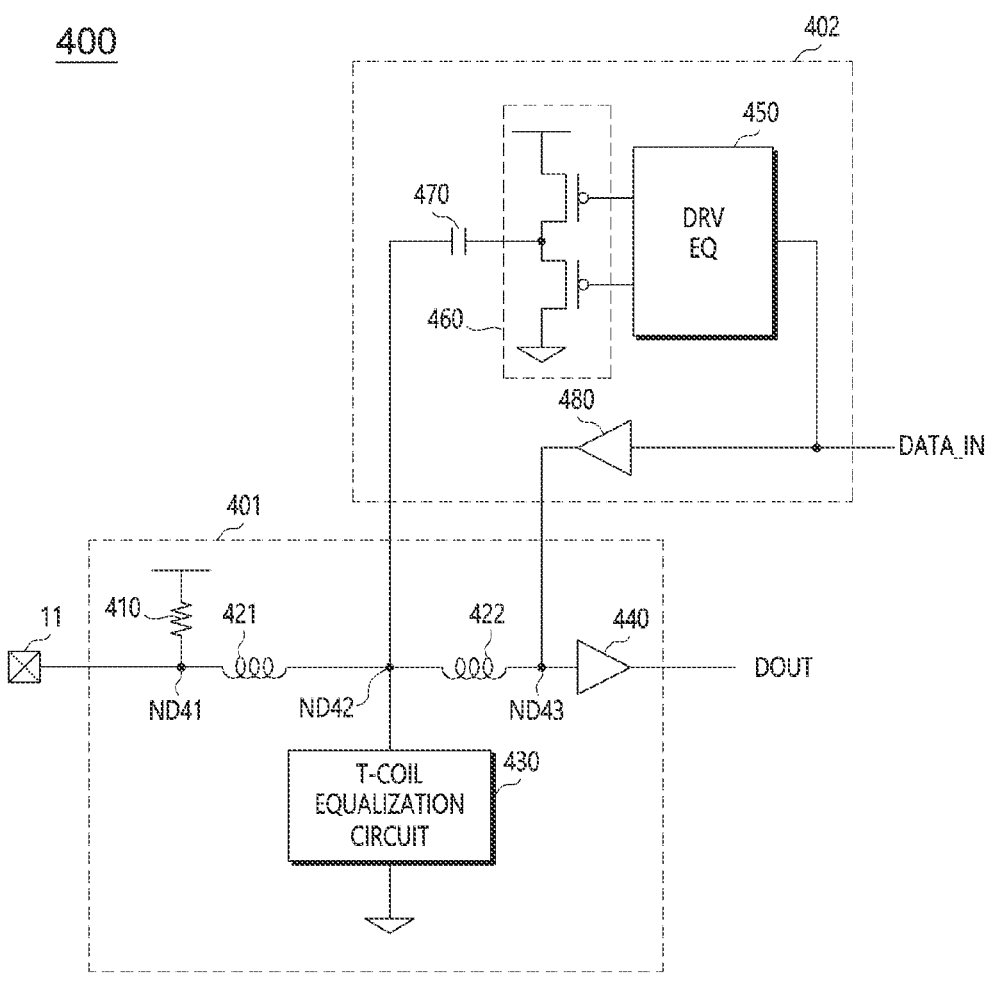
FIG. 5 is a diagram illustrating a configuration of a data transmission/receiving circuit according to an embodiment of the present disclosure.

FIG. 5 is a diagram illustrating a configuration of a data transmission/receiving circuit 400 according to an embodiment of the present invention.

Referring to FIG. 5, the data transmission/receiving circuit 400 may include a data receiving circuit 401 and a data transmission circuit 402.

The data receiving circuit 401 may include a termination resistor 410, a first inductor 421, a second inductor 422, and a T-coil equalization circuit 430. The data receiving circuit 401 may further include a buffer 440 coupled with the second inductor 422 for buffering the data DIN after it passes through the second inductor 422.

The termination resistor 410 may be coupled between a power supply and a first node ND41. The first inductor 421 may be coupled between the first node ND41 and a second node ND42. The second inductor 422 may be coupled between the second node ND42 and the third node ND43. The T-coil equalization circuit 430 may be coupled between the second node ND42 and a ground terminal. The T-coil equalization circuit 430 may correspond to the T-coil equalization circuit 130 shown in FIG. 2. The buffer 440 may be associated with the third node ND43.

The data transmission circuit 402 may include a pre-driver (DRV&EQ) 450 having an equalization function, a main driver 460, and a capacitor 470. The data transmission circuit 402 may further include a buffer 480 associated with a third node ND43.

The pre-driver 450 may receive input of internally generated data, i.e., read data Data_in, and perform an equalization operation on the read data Data_in. The pre-driver 450 may perform the equalization operation on the read data Data_in in a pre-emphasis manner. The main driver 460 may be coupled to the second node ND42 via the capacitor 470. The main driver 460 may drive the second node ND42 based on an output of the pre-driver 450. The buffer 480 may buffer the read data Data_in and output it to the third node ND43.

Figure 6:
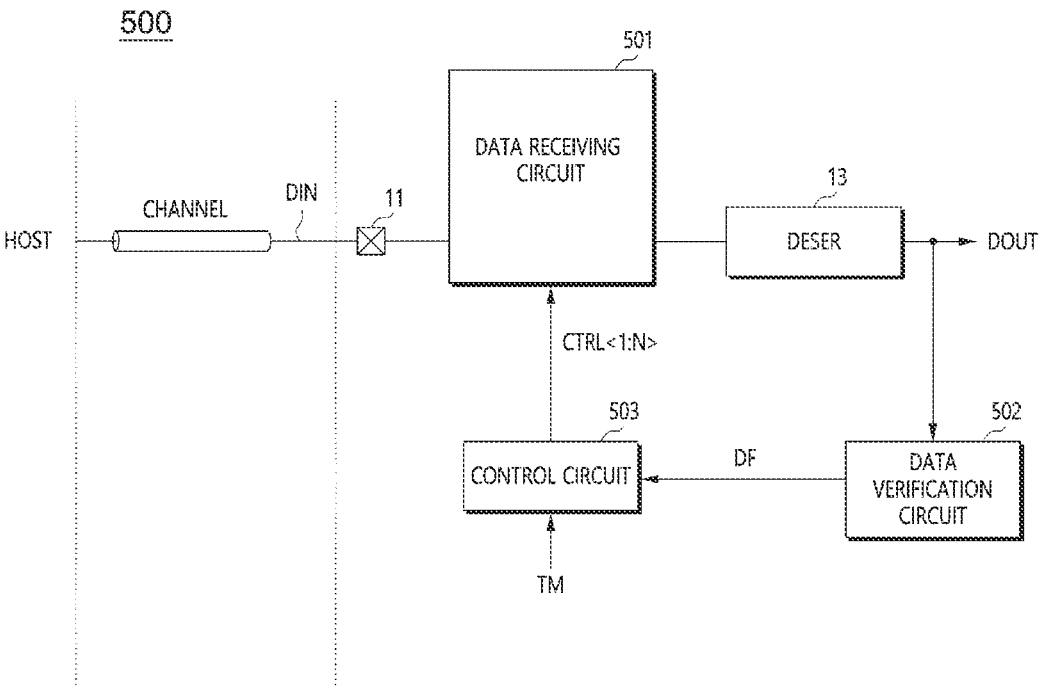
FIG. 6 is a diagram illustrating a configuration of a data training circuit according to an embodiment of the present disclosure.

FIG. 6 is a diagram illustrating a configuration of the data training circuit 500 according to an embodiment.

Referring to FIG. 6, the data training circuit 500 may include a data receiving circuit 501, a deserializer 13, a data verification circuit 502, and a control circuit 503.

The data receiving circuit 501 may be coupled to a data input/output pad 11, and be configured to control the inductive peaking according to a control signal CTRL<1:N>, and to receive data transmitted via the data input/output pad 11.

The data receiving circuit 501 may be configured by selectively applying any of the data receiving circuits 100, 200, 300, 401 described with reference to FIGS. 2 to 5.

The deserializer 13 may deserialize data output from the data receiving circuit 501 to generate parallel data DOUT.

The data verification circuit 502 may verify the parallel data DOUT to generate a data verification signal DF. The data verification circuit 502 may determine whether the parallel data DOUT is normal, that is, whether it is the same as the data transmitted from the host, based on a parity signal included in the parallel data DOUT, and may generate the data verification signal DF based on the result of the determination. The data verification circuit 502 may determine whether the parallel data DOUT is normal by performing an operation on the parallel data DOUT to generate a parity signal and comparing it to the parity signal contained in the parallel data DOUT. Data verification circuit 502 may include a parity signal operation logic. The data verification circuit 502 may output the data verification signal DF at a high level if the parallel data DOUT is normal, and may output the data verification signal DF at a low level if the parallel data DOUT is not normal.

The control circuit 503 may receive the data verification signal DF and a test mode signal TM as inputs and output the control signal CTRL<1:N>. The control circuit 503 may control the data training operation by varying the value of the control signal CTRL<1:N> until the data verification signal DF is at a value that indicates that the parallel data DOUT has been transmitted normally, i.e., a high level. The control circuit 503 may include control logic for varying the value of the control signal CTRL<1:N> based on the value of the data verification signal DF.

Alternatively, the control circuit 503 may set the value of the control signal CTRL<1:N> according to the test mode signal TM. The control circuit 503 may monitor the parallel data DOUT outside the data training circuit 500 to determine whether it is normal, and set the value of the control signal CTRL<1:N> using the test mode signal TM accordingly.

Hereinafter, the data training operation of the data training circuit 500 is described.

Data output from the host is input to the data receiving circuit 501 via the channel and the data input/output pad 11.

The data receiving circuit 501 receives the data with an impedance according to the control signal CTRL<1:N> of the default value (hereinafter, DFT).

The deserializer 13 deserializes the data output from the data receiving circuit 501 to generate parallel data DOUT.

At this time, if the signal compensation ability of the data receiving circuit 501 according to the control signal CTRL<1:N> of the default value does not compensate for the signal degradation caused by the channel, the data verification circuit 502 may output the data verification signal DF at a low level, indicating abnormal data.

The control circuit 503 changes the value of the control signal CTRL<1:N> to a value that is one step higher (DFT+1) than the default value (DFT) because the data verification signal DF is low level.

The data receiving circuit 501 receives the data with an impedance according to the control signal CTRL<1:N> of the one step increased value (DFT+1).

The data training operation may be performed by the control circuit 503 repeating the operation of changing the value of the control signal CTRL<1:N> to a value one step higher than the previous value until the data verification signal DF becomes a high level, indicating normal data.

The training method described above is only an example of increasing the value of the control signal CTRL<1:N> by one step, but training may also be performed by decreasing the value of the control signal CTRL<1:N> by one step, or by repeating the process of increasing and decreasing the value of the control signal CTRL<1:N>. In other words, it is possible to change the value of the control signal CTRL<1:N> such as DFT, DFT+1, DFT−1, DFT+2, DFT−2, etc. until the data verification signal DF is at a high level, indicating normal data.

Figure 7:
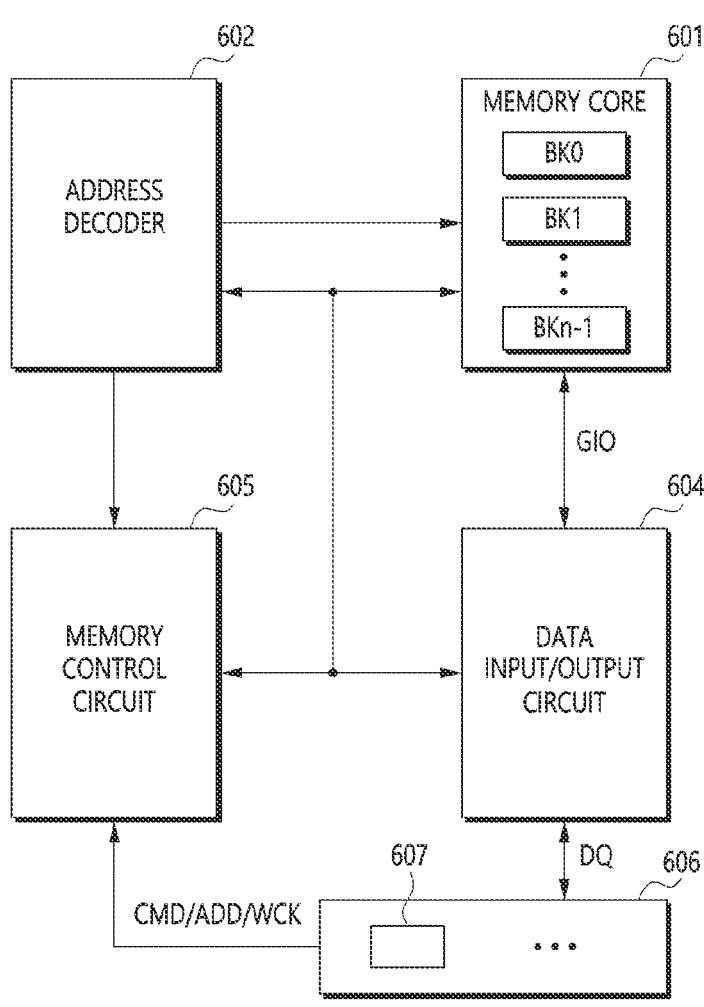
FIG. 7 is a diagram illustrating a configuration of a semiconductor apparatus according to an embodiment of the present disclosure.

FIG. 7 is a diagram illustrating a configuration of a semiconductor apparatus 600 according to an embodiment.

Referring to FIG. 7, the semiconductor apparatus 600 may include a memory core 601, an address decoder 602, a data input/output circuit 604, a memory control circuit 605, and an input/output pad unit 606.

The memory core 601 may include a plurality of unit cells, and the plurality of unit cells may include at least one of volatile memory and non-volatile memory. The volatile memory may include SRAM (Static RAM), DRAM (Dynamic RAM), and SDRAM (Synchronous DRAM). The non-volatile memory may include ROM (Read Only Memory), PROM (Programmable ROM), EEPROM (Electrically Erase and Programmable ROM), EPROM (Electrically Programmable ROM), flash memory, PRAM (Phase change RAM), MRAM (Magnetic RAM), RRAM (Resistive RAM), and FRAM (Ferroelectric RAM). The unit cells of the memory core 601 may be divided into a plurality of memory regions, such as a plurality of memory banks BK0-BKn−1.

The address decoder 602 may be associated with the memory control circuit 605 and the memory core 601. The address decoder 602 may decode an address signal provided by the memory control circuit 605 and may access the memory core 601 in response to the decoding result.

A data input/output circuit 604 may be coupled to the memory core 601 via a global input/output line GIO. The data I/O circuit 604 may exchange data with an external system or the memory core 601.

The data input/output circuit 604 may include at least one of the data receiving circuits 100, 200, and 300 of FIGS. 2 to 4, the data transmission/receiving circuit 400 of FIG. 5, and the data training circuit 500 of FIG. 6.

The data input/output circuit 604 can compensate for signal quality degradation due to inter-symbol interference in the channel by varying the AC resistance of the T-coil equalization circuit while the DC resistance due to the termination resistor is constant. By using the T-coil equalization circuit, there is no reduction in DC gain, and the current consumption can be reduced compared to using a continuous time-linear equalizer in the prior art.

A memory control circuit 605 may be coupled with the memory core 601, the address decoder 602, and the data input/output circuit 604. The memory control circuit 605 may be provided with a command CMD, address ADD, clock signal WCK, and the like. The memory control circuit 605 may provide the address decoded by the address decoder 602 to the data input/output circuit 604. The memory control circuit 605 can control a test operation and normal operation of the semiconductor apparatus 600. The normal operation may include a read operation, a write operation, and an address processing operation.

The input/output pad unit 606 may include a plurality of pads 607 for receiving the command CMD, address ADD, and clock signal WCK, and for inputting and outputting data DQ. Hereinafter, the pads for inputting and outputting data DQ will be referred to as the plurality of data input/output pads. Any one of the plurality of data input/output pads may be used to input data provided by the host.

A person skilled in the art to which the present disclosure pertains will understand that the present disclosure may be carried out in other specific forms without changing its technical spirit or essential features. Therefore, it should be understood that the embodiments described above are illustrative in all aspects, not limitative. The scope of the present disclosure is defined by the claims described below rather than the detailed description, and it should be construed that the meaning and scope of the claims and all changes or modified forms derived from the equivalent concept thereof are included in the scope of the present disclosure.

What is claimed is:

1. A data receiving circuit comprising:
   a first inductor coupled between a first node coupled with a data input/output pad and a second node;
   a second inductor coupled between the second node and an internal circuit; and a T-coil equalization circuit including a T-coil with at least one capacitor coupled with the second node, the T-coil equalization circuit configured to adjust inductive peaking of the T-coil in response to a control signal.

2. The data receiving circuit of claim 1, further comprising a termination resistor coupled to the first node.

3. The data receiving circuit of claim 1, further comprising a termination resistor coupled to the second node.

4. The data receiving circuit of claim 1, further comprising a termination resistor coupled between the second node and the internal circuit.

5. The data receiving circuit of claim 1, wherein the internal circuit comprises a deserializer.

6. The data receiving circuit of claim 1, wherein the T-coil equalization circuit comprises:

a plurality of resistors coupled to a ground terminal; and a plurality of switches coupled between the at least one capacitor and the plurality of resistors, the plurality of switches configured to operate in response to the control signal.

7. A data training circuit comprising:

a data receiving circuit coupled with a data input/output pad, the data receiving circuit configured to control inductive peaking according to a control signal and configured to receive data transmitted via the data input/output pad;

a deserializer configured to deserialize data output from the data receiving circuit to generate parallel data;

a data verification circuit configured to verify the parallel data to generate a data verification signal; and a control circuit configured to vary a value of the control signal until the data verification signal has a value indicating that the parallel data has been transmitted normally.

8. The data training circuit of claim 7, wherein the data receiving circuit comprises:

a first inductor coupled between a first node coupled with the data input/output pad and a second node;

a second inductor coupled between the second node and an internal circuit; and a T-coil equalization circuit including a T-coil with at least one capacitor coupled with the second node, the T-coil equalization circuit configured to adjust inductive peaking of the T-coil in response to the control signal.

9. The data training circuit of claim 8, further comprising a termination resistor coupled to the first node.

10. The data training circuit of claim 8, further comprising a termination resistor coupled to the second node.

11. The data training circuit of claim 8, further comprising a termination resistor coupled between the second node and the internal circuit.

12. The data training circuit of claim 8, wherein the T-coil equalization circuit comprises:

a plurality of resistors coupled to a ground terminal; and a plurality of switches coupled between the at least one capacitor and the plurality of resistors, the plurality of switches configured to operate in response to the control signal.

13. The data training circuit of claim 7, wherein the data verification circuit is configured to:

determine whether the parallel data is normal according to a parity signal included in the parallel data; and generate the data verification signal according to the result of the determination.

14. The data training circuit of claim 7, wherein the data verification circuit comprises a parity signal operation logic to generate the data verification signal based on a result of comparing a first parity signal contained in the parallel data with a second parity signal generated by performing an operation on the parallel data.

15. The data training circuit of claim 7, wherein the control circuit is configured to vary a value of the control signal according to a test mode signal.

16. A data transmission/receiving circuit comprising:

a data receiving circuit comprising a first inductor coupled between a first node coupled with a data input/output pad and a second node, a second inductor coupled between the second node and a third node, and a T-coil equalization circuit including a T-coil with at least one capacitor coupled between the second node and a ground terminal, the T-coil equalization circuit configured to adjust inductive peaking of the T-coil in response to a control signal; and a data transmission circuit coupled to the second node and configured to perform a driving operation and equalization operation on internally generated data.

17. The data transmission/receiving circuit of claim 16, further comprising a termination resistor coupled to the first node, the second node, or the third node.

18. The data transmission/receiving circuit of claim 16, further comprising:

a first buffer coupled to the third node and configured to buffer data externally input via the data input/output pad and passed through the second inductor; and a second buffer coupled to the third node and configured to buffer the internally generated data and output it to the second inductor.

19. The data transmission/receiving circuit of claim 16, wherein the T-coil equalization circuit comprises:

a plurality of resistors coupled to the ground terminal; and a plurality of switches coupled between the at least one capacitor and the plurality of resistors, the plurality of switches configured to operate in response to the control signal.

20. The data transmission/receiving circuit of claim 16, wherein the data transmission circuit comprises:

a pre-driver configured to perform the equalization operation on the internally generated data; and a main driver configured to drive the second node according to an output of the pre-driver.

* * * * *